United States Patent [19]

Kraus

[11] Patent Number: 5,852,376
[45] Date of Patent: Dec. 22, 1998

[54] BANDGAP REFERENCE BASED POWER-ON DETECT CIRCUIT INCLUDING A SUPRESSION CIRCUIT

[75] Inventor: William F. Kraus, Colorado Springs, Colo.

[73] Assignee: Ramtron International Corporation, Colorado Springs, Colo.

[21] Appl. No.: 702,363

[22] Filed: Aug. 23, 1996

[51] Int. Cl.[6] ...................................................... H03L 7/00
[52] U.S. Cl. ........................................... 327/143; 327/539
[58] Field of Search ................................... 327/52, 60, 63, 327/65, 68, 72, 74, 77–82, 89, 90, 143, 198, 205, 539–541, 560–563, 34, 37

[56] References Cited

U.S. PATENT DOCUMENTS

| | | | |
|---|---|---|---|
| 5,359,552 | 10/1994 | Dhong et al. | 327/539 |
| 5,440,254 | 8/1995 | Sundby | 327/79 |
| 5,477,176 | 12/1995 | Chang et al. | 327/143 |
| 5,514,951 | 5/1996 | Halim et al. | 323/901 |
| 5,530,398 | 6/1996 | Shamlou et al. | 327/545 |
| 5,532,576 | 7/1996 | MacRobbie et al. | 323/274 |
| 5,619,156 | 4/1997 | Jandu | 327/539 |

*Primary Examiner*—Timothy P. Callahan
*Assistant Examiner*—My-Trang Nu Ton
*Attorney, Agent, or Firm*—Peter J. Meza, Esq.

[57] ABSTRACT

A power-on detect circuit includes: a resistor divider having a first node, a second node coupled to ground, and a center tap; a bandgap circuit for providing a reference voltage; a differential amplifier having a first input for receiving the reference voltage, a second input coupled to the center tap of the bandgap reference voltage circuit, and an output for providing a power-on detect signal; and a suppression circuit for coupling the first node of the resistor divider to a source of supply voltage once the reference voltage substantially achieves a stable reference voltage level. The suppression circuit has an input for receiving a trigger voltage generated in the bandgap circuit, and an output coupled to the first node of the resistor divider. The suppression circuit includes: an input section having an input for receiving the trigger voltage, and an output; a switch coupled between the source of supply voltage and the first node of the resistor divider having a control node coupled to the output of the input section; and a capacitor coupled to the control node of the switch. Both the switch and the bandgap circuit are responsive to the power-on detect signal for further reducing power consumption.

9 Claims, 5 Drawing Sheets

BANDGAP REFERENCE BASED POWER-ON DETECT CIRCUIT INCLUDING A SUPRESSION CIRCUIT

BACKGROUND OF THE INVENTION

This invention relates generally to "power-on detect" circuits, sometimes referred to simply as "power detect", "power-on reset", "power enable" or "voltage detect" circuits. These circuits generally provide a power-on signal that indicates when the voltage level of a power supply voltage source has attained a predetermined acceptable level. More particularly, the present invention relates to a power-on detect circuit well suited for low voltage power supply operation less than or equal to 3.3 volts, and including a suppression circuit for eliminating false power-on signal indications.

Referring now to FIG. 1, a block diagram of a prior art power-on detect circuit 10 is shown including a resistor divider 12, a bandgap reference circuit 20, and a differential amplifier or comparator 24. Resistor divider 12 includes resistors 14 and 16. A first node 13 of resistor divider 12 is typically coupled to the VDD power supply voltage source, and a second node 17 of resistor divider 12 is typically coupled to ground. Resistors 14 and 16 are ratioed so that the output voltage, ROUT, on center tap 18 is equal to the VREF reference voltage on line 22 of bandgap reference circuit 20 when the VDD power supply voltage has attained the desired level. The ROUT voltage and the VREF reference voltage are compared by comparator 24. Once the ROUT voltage has exceeded the VREF reference voltage, a power-on signal PWREN is provided at the output of comparator 24 on node 26. The PWR signal indicates that the power supply voltage is in the acceptable range, and can be used to control various functions on, for example, an integrated circuit.

In FIG. 2, the ideal ROUT, VREF, and VDD voltages corresponding to the same labeled voltages shown in FIG. 1 are plotted against time. Initially, all three voltages are zero. As the power supply voltage is increased, the VDD power supply voltage and the VREF reference voltage rise together. The ROUT center tap voltage also rises, but at a linear ratio of the VDD and VREF voltages. At some point, typically about 1.1 volts for a bandgap reference voltage, the VDD and VREF voltages diverge. The VDD power supply voltage and the ROUT center tap voltage continue to increase, whereas the VREF reference voltage remains constant. At time t1, the ROUT and VREF voltages are equal, which corresponds in FIG. 2 to a power supply voltage of about 2.5 volts. Shortly after time t1, a valid PWREN power-on signal is generated.

In FIG. 3, the non-ideal ROUT, VREF, and VDD voltages corresponding to the same labeled voltages shown in FIG. 1 are plotted against time. In particular, the "non-ideal" or actual VREF voltage waveform for a typical bandgap circuit is dramatically different than the idealized version. As in FIG. 2, initially all three voltages are zero. As the power supply voltage is increased, the VDD power supply voltage, the ROUT center tap voltage, and the VREF reference voltage all rise at different rates. Notably, the VREF voltage rises at a rate slower than the ROUT voltage waveform, at least initially. At time t0, the VREF reference voltage quickly rises to its final value, typically about 1.1 volts. As the VREF voltage rises to its final value, it crosses the ROUT voltage. An undesirable false power-on signal indication can be produced at anytime prior to time t0. If a false power-on signal indication is generated, it will correspond to a VDD voltage significantly less than the desired minimum VDD voltage.

At low VDD supply voltages, a false power-on signal indication cannot be tolerated due to the extremely low power supply margin voltages. For example, if a 2.5 volt minimum VDD level is set for a valid power-on signal indication (which would correspond to a nominal three or 3.3 volt VDD power supply level), a voltage difference of as little as one hundred millivolts, i.e. a 2.4 volt supply voltage is unacceptable.

What is desired, therefore, is a power-on detect circuit that is compatible with low voltage operation and will not provide false power-on detect signals corresponding to an unacceptably low power supply voltage.

SUMMARY OF THE INVENTION

It is, therefore, a principal object of the present invention to provide a low voltage power-on detect circuit.

It is another object of the invention to eliminate false power-on detect signals corresponding to an unacceptably low power supply voltage.

It is an advantage of the invention that it can be fabricated with standard MOS semiconductor processes.

It is another advantage of the invention that relatively few devices are used and therefore integrated circuit area is conserved.

It is another advantage of the invention that power consumption is minimal and can be reduced even further once the power-on signal is generated.

According to the present invention a power-on detect circuit includes: a resistor divider having a first node, a second node coupled to ground, and a center tap; a bandgap circuit for providing a reference voltage; a differential amplifier having a first input for receiving the reference voltage, a second input coupled to the center tap of the bandgap reference voltage circuit, and an output for providing a power-on detect signal; and a suppression circuit for coupling the first node of the resistor divider to a source of supply voltage once the reference voltage substantially achieves a stable reference voltage level. The suppression circuit has an input for receiving a trigger voltage generated in the bandgap circuit, and an output coupled to the first node of the resistor divider. The suppression circuit includes: an input section having an input for receiving the trigger voltage, and an output; a switch coupled between the source of supply voltage and the first node of the resistor divider having a control node coupled to the output of the input section; and a capacitor coupled to the control node of the switch. Both the switch and the bandgap circuit are responsive to the power-on detect signal for further reducing power consumption.

In operation, an acceptable level of a power supply voltage is detected using a bandgap circuit and a resistor divider by: coupling the first node of the resistor divider to the power supply voltage source once the reference voltage generated by the bandgap circuit substantially achieves a stable reference voltage level; comparing a voltage on the center tap of the resistor divider to the reference voltage; and generating a power-on detect signal indicating an acceptable level of power supply voltage has been reached if the center tap voltage exceeds the reference voltage.

The foregoing and other objects, features and advantages of the invention will become more readily apparent from the following detailed description of a preferred embodiment of the invention which proceeds with reference to the accompanying drawings.

DETAILED DESCRIPTION

Figure 4:
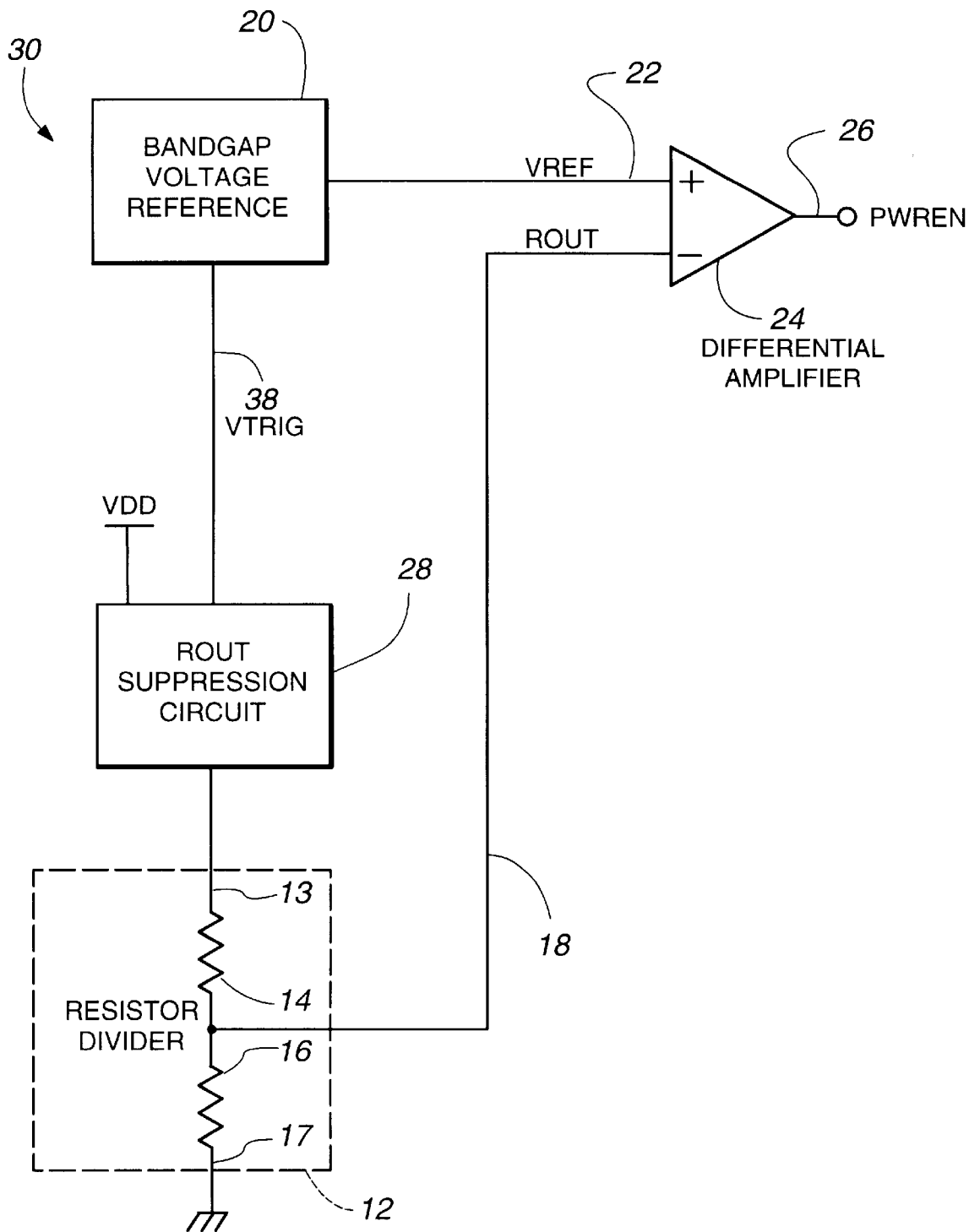
FIG. 4 is a block diagram of a power-on reset circuit and suppression circuit according to the present invention.

Referring now to FIG. 4, there are four basic building blocks for power-on detect circuit 30. Power-on detect circuit 30 includes a resistor divider 12 having a first node 13, a second node 17 coupled to ground, and a center tap 18. For the purposes of this patent application, "ground" is defined as either zero volts or a stable DC voltage, typically designated VSS, such as −5 volts, −12 volts or the like. The voltage on the center tap 18 of resistor divider 12 is designated ROUT. A bandgap circuit 20 provides a reference voltage designated VREF on node 22. A comparator or differential amplifier 24 has a positive input for receiving the VREF reference voltage, a negative input coupled to the center tap 18 of the resistor divider 12, and an output for providing a power-on detect signal designated PWREN at node 26. A suppression circuit 28 couples the first node 13 of the resistor divider to the VDD power supply once the VREF reference voltage substantially achieves a stable reference voltage level. In other words, suppression circuit 28 suppresses the ROUT voltage on the center tap 18 of resistor divider 12 until the VREF reference voltage substantially achieves a stable reference voltage level. Each of the four basic building blocks of circuit 30 is described in greater detail below with reference to the schematic diagrams of FIGS. 6 and 7.

In operation, the method for detecting an acceptable level of power supply voltage VDD includes: coupling the first node 13 of the resistor divider 12 to the VDD power supply voltage source once the VREF reference voltage generated by the bandgap circuit 20 substantially achieves a stable reference voltage level; comparing the ROUT voltage on the center tap 18 of the resistor divider 12 to the VREF reference voltage with differential amplifier 24; and generating a power-on detect signal PWREN at node 26 indicating an acceptable level of power supply voltage has been reached if the center tap voltage ROUT exceeds the reference voltage VREF.

Figure 1:
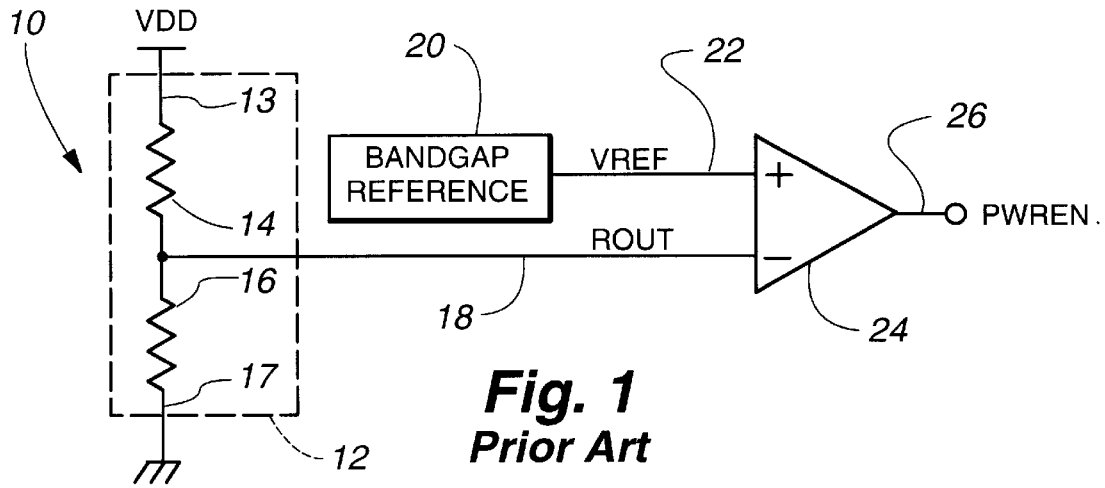
FIG. 1 is a block diagram of a prior art power-on reset circuit.
Figure 2:
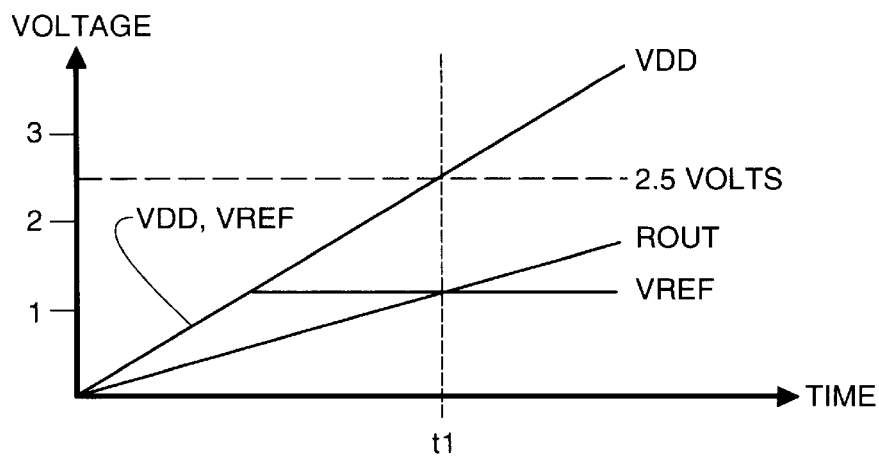
FIG. 2 is a plot of the ideal VDD, VREF, and ROUT voltage waveforms versus time associated with the block diagram of FIG. 1 showing a power-on signal indication corresponding to a VDD voltage of about 2.5 volts.
Figure 3:
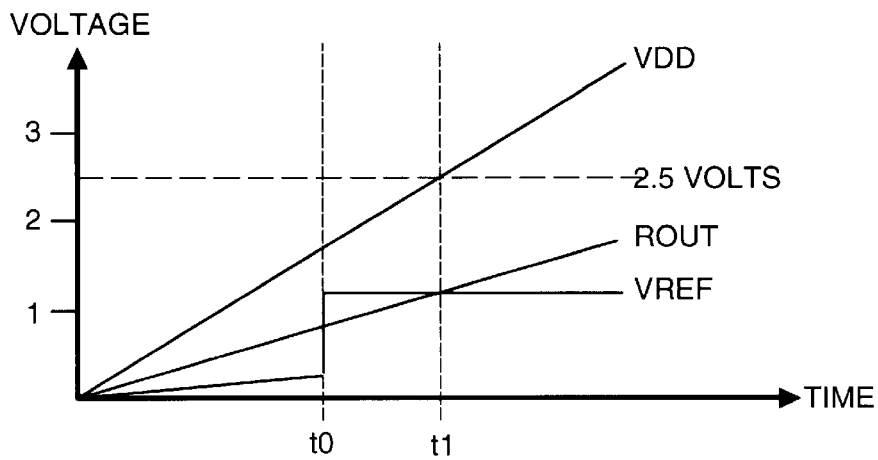
FIG. 3 is a plot of the non-ideal VDD, VREF, and ROUT voltage waveforms versus time associated with the block diagram of FIG. 1 showing a false power-on signal indication corresponding to a VDD voltage less than two volts.
Figure 5:
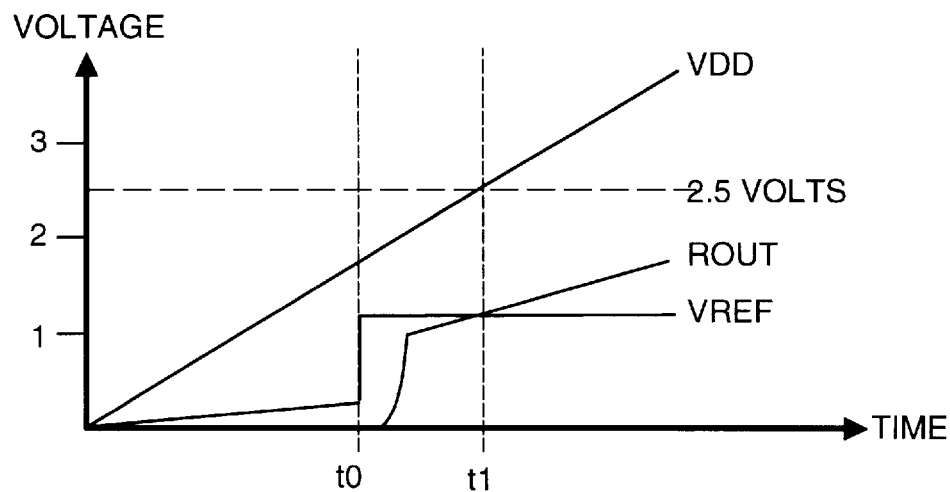
FIG. 5 is a plot of the VDD, VREF, and ROUT voltage waveforms versus time associated with the block diagram of FIG. 4 showing a power-on signal indication corresponding to a VDD voltage of about 2.5 volts.

Referring now to FIG. 5, a plot of the VDD, VREF, and ROUT voltage waveforms versus time associated with the block diagram of FIG. 4 shows a power-on signal indication corresponding to a VDD voltage of about 2.5 volts at time t1. Note in FIG. 5 that although the VREF voltage waveform is the same as is shown in FIG. 3, a false power-on signal is not generated prior to time t0, because the ROUT voltage is suppressed until some point after the VREF voltage reaches its stable value. A valid power-on signal is generated at time t1, corresponding to the desired minimum VDD voltage of about 2.5 volts.

Figure 6:
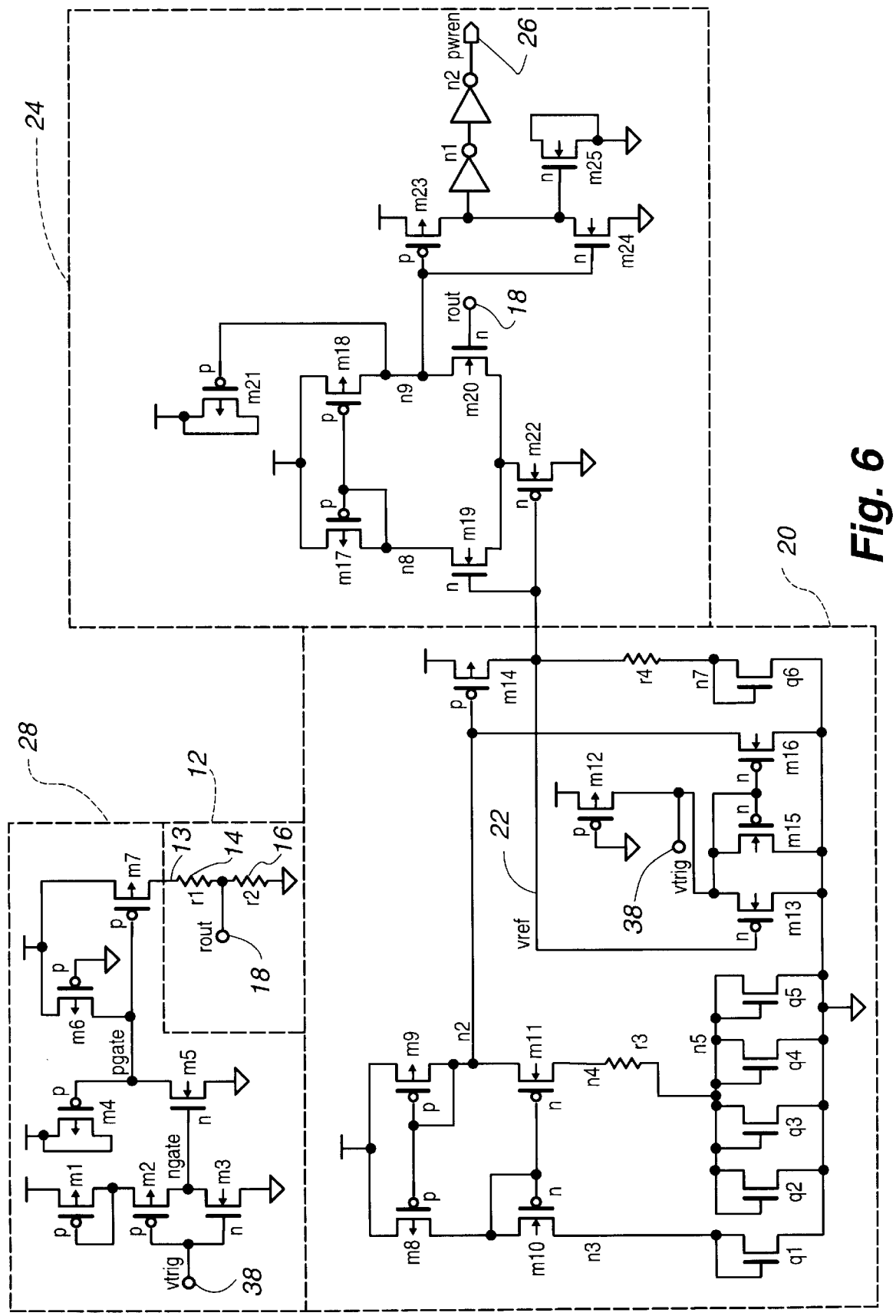
FIG. 6 is a schematic diagram of a first embodiment of the power-on reset circuit and suppression circuit according to the present invention.
Figure 7:
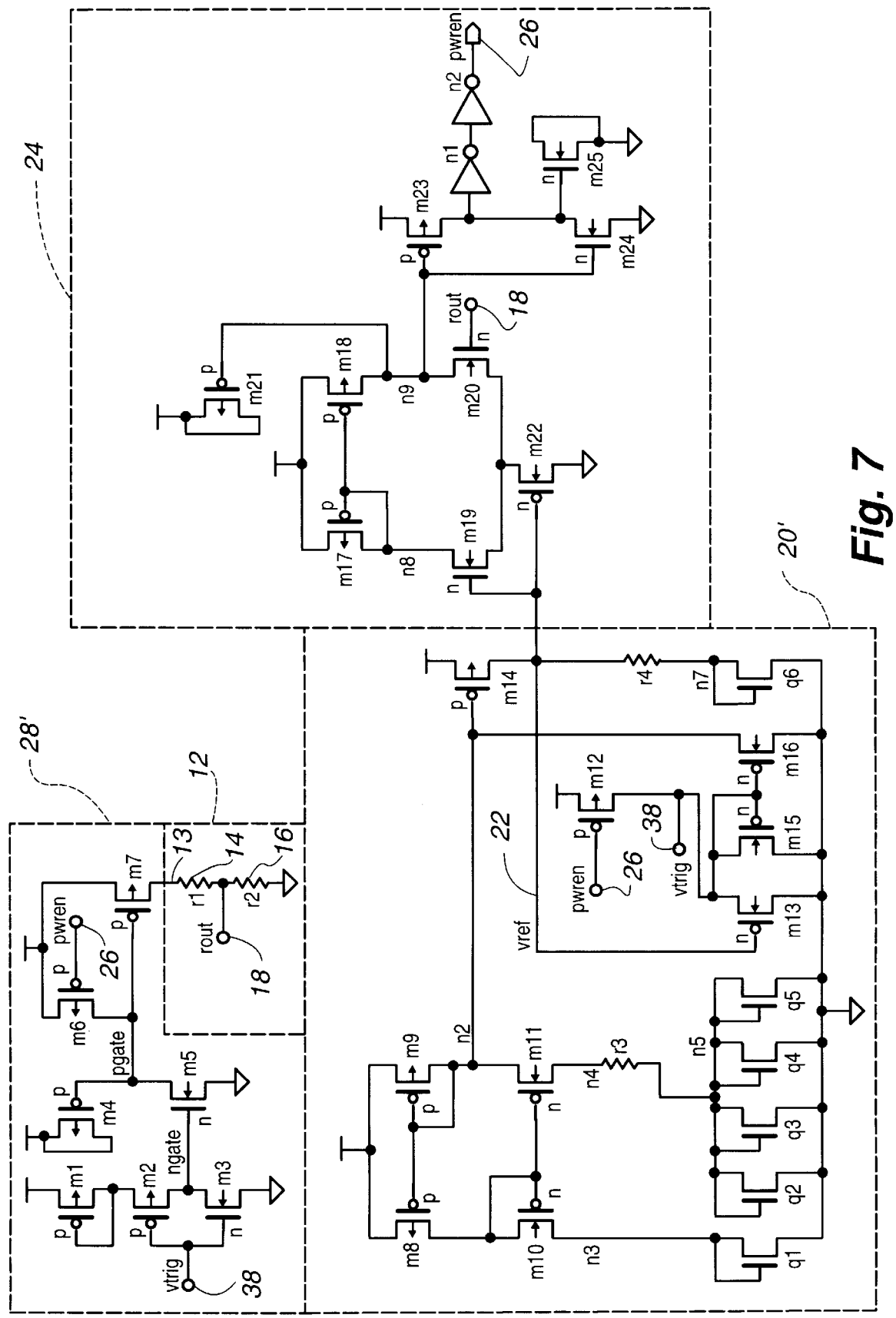
FIG. 7 is a schematic diagram of a second embodiment of the power-on reset circuit and suppression circuit according to the present invention, which includes a feature to further reduce power consumption.

Referring now to FIGS. 6 and 7, resistor divider 12 includes resistors 14 and 16. Resistor 14 is coupled between first node 13 and the center tap node 18. Resistor 16 is coupled between the center tap node 18 and the second node 17. Resistors 14 and 16 are sized so that minimal power is consumed once circuit 30 is fully operational at an acceptable VDD power supply voltage. A total resistance of about a megohm or more is desirable. Resistors 14 and 16 are ratioed such that the center tap voltage ROUT is equal to the VREF voltage at the minimum acceptable level of VDD power supply voltage. For example, if the total resistance is equal to a megohm, ground is zero volts, VREF is equal to 1.16 volts, and the desired minimum VDD is 2.5 volts, resistor 14 has a value of about 536 Kohms, and resistor 16 has a value of about 464 Kohms.

Figure 8:
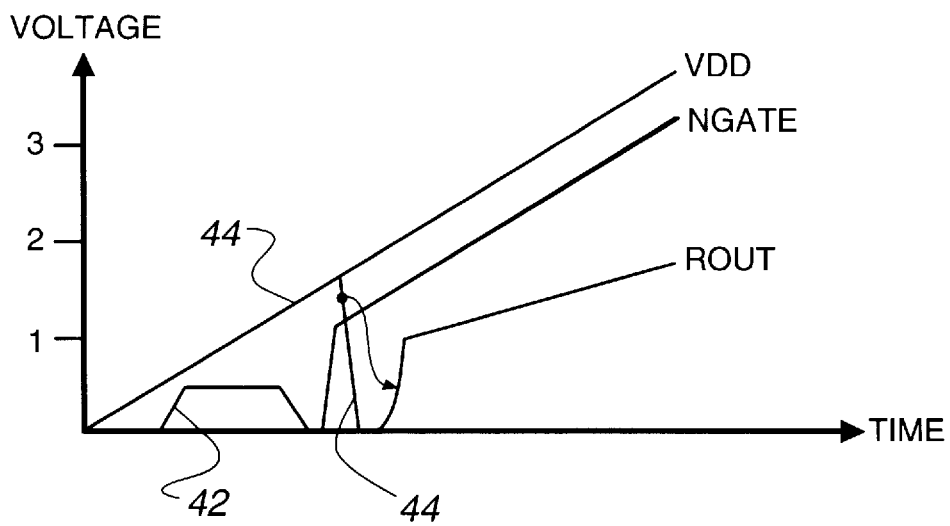
FIG. 8 is a plot of the VDD, NGATE, ROUT, VTRIG, and PGATE voltage waveforms versus time associated with the schematic diagrams of FIGS. 6 and 7.

Bandgap voltage reference circuits 20 and 20' are based upon a classic bandgap reference design, which supplies a constant VREF reference voltage of about 1.16 volts at node 22. The reference voltage varies minimally due to variations in process, voltage and temperature. Bandgap circuit 20 has two stable modes, one with no current flow and no voltage reference and the other with current flow and a voltage reference. To insure the bandgap circuit 20 is initialized in the correct mode, devices M12, M13, M15, and M16 are included as part of a "start-up" circuit to cause current to flow in current mirror devices M8–M11, and M14, as well as bipolar devices Q1–Q6. A trigger voltage labeled VTRIG is generated by bandgap circuit 20 at node 38. The VTRIG waveform 42 is best seen in FIG. 8. The VTRIG signal is used by suppression circuit 28 as is described in further detail below. Referring now to FIG. 7, bandgap circuit 20' is responsive to the power-on detect signal PWREN for further reducing power consumption. Note that the gate of device M12 is coupled to node 26 for receiving the PWREN signal. Once the PWREN signal becomes active and the proper VDD level has been attained, device M12 is turned off, denying current to initialization devices M15 and M16, further reducing power consumption.

Referring again to FIGS. 6 and 7, suppression circuits 28 and 28' have an input at node 38 for receiving the VTRIG trigger voltage, and an output coupled to the first node 13 of resistor divider 12.

Suppression circuits 28 and 28' include an input section comprised of devices M1, M2, M3, and M5. Devices M2 and M3 have coupled source/drains to form an inverter, the input of which receives the VTRIG trigger voltage at node 38. Device M2 is a P-channel MOS transistor, and device M3 is an N-channel MOS transistor. The other source/drain of M3 is coupled to ground. The other source/drain of M2 is coupled through diode-connected P-channel device M1 to the VDD power supply. The output of the inverter is labeled NGATE, which is coupled to the gate of device M5. Device M5 is an N-channel MOS transistor. One source/drain of M5 forms the output of the input section labeled PGATE, and the other source/drain is coupled to ground.

Suppression circuits 28 and 28' also include a switch coupled between the source of VDD supply voltage and the first node 13 of the resistor divider 12. The switch includes P-channel MOS devices M6 and M7. The gate of M7 and a source/drain of M6 are coupled together to form a control node (PGATE), which is also coupled to the output of the input section (i.e. source/drain of M5). The gate of M6 is coupled to ground in suppression circuit 28. The other source/drains of M6 and M7 are coupled to VDD. Referring to suppression circuit 28' in FIG. 7, the gate of M6 receives the PWREN power-on detect signal on node 26, instead of being coupled to ground. When PWREN is active high, M6 is turned off, which denies current flow into M5 and further reduces power consumption.

Suppression circuits 28 and 28' also include a capacitor coupled to the control node of the switch (PGATE). The capacitor is a capacitor-connected P-channel transistor M4. The gate of M4 forms one plate of the capacitor, and the coupled source/drains of M4 form the other plate of the capacitor, which is coupled to VDD.

Referring again to FIGS. 6 and 7, as well as FIG. 8, suppression circuits 28 and 28' use the VTRIG signal on node 38 generated in the voltage reference bandgap circuit 20 to detect when the VREF reference voltage is nearing stability. Note that in FIG. 8, waveform 42 is the VTRIG voltage, and waveform 44 is the PGATE voltage. The VDD, NGATE, and ROUT voltages are labeled on the right side of FIG. 8. Once VDD reaches an adequate potential to output a stable bandgap voltage, the voltage on the VREF node 22 turns on device M13 (in bandgap circuit 20) which in turn pulls VTRIG low. The onset of stability of VREF varies based on the process and temperature, but the actual VREF voltage level does not. Once VTRIG goes below an N-channel threshold voltage ($V_{TN}$) device M3 (in suppression circuit 28) turns off. In turn, this then allows transistors M1 and M2 to pull NGATE up to a voltage of about VDD-$V_{TP}$ (P-channel threshold voltage). Once NGATE rises high enough, transistor M5 turns on. In turn, the PGATE voltage is pulled down from the VDD rail so that transistor M7 is turned on. Consequently, resistor divider 12 is enabled to bring the ROUT voltage up to the ratioed voltage so that it may be compared with VREF. Note also in FIG. 8 the presence of an arrow indicating that the trailing edge of the PGATE waveform 44 allows the leading edge of the ROUT waveform to occur, which eventually achieves the proper ratioed voltage and crosses the VREF voltage, as seen in FIG. 5.

Differential amplifier 24 is of conventional design. Other designs for differential amplifiers or comparators can be used. Differential amplifier 24 simply compares the VREF and ROUT voltages to determine when VDD is above a predetermined minimum acceptable level. Also, the VREF voltage is used to enable differential amplifier 24 by gating transistor M22. This further helps the circuit functionality by inhibiting differential amplifier 24 until VREF has substantially achieved a stable voltage. The PWREN power-on detect signal is the output of differential amplifier circuit 24 at node 26. The PWREN signal is high when VDD is above the minimum acceptable level, and low when it is below the minimum acceptable level. If desired, hysteresis can be built into either differential amplifier 24 or resistor divider 12, as is further described in U.S. Pat. No. 5,479,172 to Smith et al entitled "Power Supply and Power Enable Circuit for an RF/ID Transponder", issued on Dec. 26, 1995. The PWREN signal can be used to control various functions on an integrated circuit The PWREN signal is especially useful in protecting the integrity of data in a ferroelectric memory, for example, by allowing data to be written and read only when sufficient voltage exists to properly operate the memory.

Bandgap reference circuit 30 may be designed so that it has low power consumption requirements, yet is able to react to expected VDD ramp rates. However, there is a point for fast VDD ramp rates where the internal circuit nodes cannot react in sufficient time for the circuit to function properly. Thus, there is a tradeoff between power consumption and reaction time that should be considered. Also, parasitic capacitance associated with resistor divider 12 may cause the ROUT voltage to lag the VDD power supply voltage in time if the ramp rate is too fast. For this reason, integrated circuits usually have a one-sided specification for ramp rate, with a minimum ramp rate for VDD but no maximum. The minimum allowed ramp rate is typically 100 μS, although in actual system use the integrated circuit may rarely see ramp rates faster than 1 mS.

Having described and illustrated the principles of the invention in a preferred embodiment thereof, it is appreciated by those having skill in the art that the invention can be modified in arrangement and detail without departing from such principles. For example, the ratio of resistors 14 and 16 can be changed as required to signal a different minimum power supply level, and the total resistance can be changed as desired. Alternative bandgap and differential amplifier circuits can be used, and the specific arrangement and location of the suppression circuit 28 can be changed while still achieving the same functionality of the present invention. I therefore claim all modifications and variation coming within the spirit and scope of the following claims.

I claim:

1. A power-on detect circuit comprising:
    a resistor divider having a first node, a second node coupled to ground, and a center tap;
    a bandgap circuit for providing a reference voltage;
    a differential amplifier having a first input for receiving the reference voltage, a second input coupled to the center tap of the resistor divider, and an output for providing a power-on detect signal;
    an input section having an input for receiving a trigger voltage and an output;
    a switch coupled between a source of supply voltage and the first node of the resistor divider having a control node coupled to the output of the input section; and
    a capacitor-connected transistor coupled to the control node of the switch, such that the first node of the resistor divider is coupled to a source of supply voltage once the reference voltage substantially achieves a stable reference voltage level.

2. A power-on detect circuit comprising:
    a resistor divider having a first node, a second node coupled to ground, and a center tap;
    a bandgap circuit for providing a reference voltage;
    a differential amplifier having a first input for receiving the reference voltage, a second input coupled to the center tap of the resistor divider, and an output for providing a power-on detect signal;
    an inverter having an input for receiving a trigger voltage and an output;
    a transistor having a gate coupled to the output of the inverter, a first current node, and a second current node coupled to ground; and
    a switch coupled between a source of supply voltage and the first node of the resistor divider having a control node coupled to the first current node of the transistor, such that the first node of the resistor divider is coupled to the source of supply voltage once the reference voltage substantially achieves a stable reference voltage level.

3. A power-on detect circuit as in claim 2 in which the transistor comprises an N-channel MOS transistor.

4. A power-on detect circuit comprising:

a resistor divider having a first node, a second node coupled to ground, and a center tap;

a bandgap circuit for providing a reference voltage;

a differential amplifier having a first input for receiving the reference voltage, a second input coupled to the center tap of the resistor divider, and an output for providing a power-on detect signal;

an input section having an input for receiving a trigger voltage and an output; , a first transistor having a first current node coupled to a source of supply voltage, a second current node coupled to the output of the input section, and a gate coupled to ground; and a second transistor having a first current node coupled to the source of supply voltage, a second current node coupled to first node of the resistor divider, and a gate coupled to the output of the input section, such that the first node of the resistor divider is coupled to the source of supply voltage once the reference voltage substantially achieves a stable reference voltage level.

5. A power-on detect circuit as in claim 4 in which the first transistor comprises a P-channel MOS transistor.

6. A power-on detect circuit as in claim 4 in which the second transistor comprises a P-channel MOS transistor.

7. A power-on detect circuit comprising:

a resistor divider having a first node, a second node coupled to ground, and a center tap;

a bandgap circuit for providing a reference voltage;

a differential amplifier having a first input for receiving the reference voltage, a second input coupled to the center tap of the resistor divider, and an output for providing a power-on detect signal;

an input section having an input for receiving a trigger voltage and an output;

a first transistor having a first current node coupled to a source of supply voltage, a second current node coupled to the output of the input section, and a gate for receiving the power-on detect signal; and a second transistor having a first current node coupled to the source of supply voltage, a second current node coupled to first node of the resistor divider, and a gate coupled to the output of the input section, such that the first node of the resistor divider is coupled to the source of supply voltage once the reference voltage substantially achieves a stable reference voltage level.

8. A power-on detect circuit as in claim 7 in which the first transistor comprises a P-channel MOS transistor.

9. A power-on detect circuit as in claim 7 in which the second transistor comprises a P-channel MOS transistor.

* * * * *